United States Patent [19]
Watanabe et al.

[11] Patent Number: 5,609,690
[45] Date of Patent: Mar. 11, 1997

[54] VACUUM PLASMA PROCESSING APPARATUS AND METHOD

[75] Inventors: Syouzou Watanabe, Moriguchi; Masaki Suzuki, Hirakata; Ichiro Nakayama, Kadoma; Tomohiro Okumura, Neyagawa, all of Japan

[73] Assignee: Matsushita Electric Industrial Co., Ltd., Osaka-fu, Japan

[21] Appl. No.: 389,229

[22] Filed: Feb. 15, 1995

[30] Foreign Application Priority Data

Feb. 15, 1994 [JP] Japan .................................. 6-018280

[51] Int. Cl.⁶ .................................................. C23C 16/00
[52] U.S. Cl. ................................ 118/723 E; 118/723 ER
[58] Field of Search ...................... 118/723 E, 723 ER; 156/345; 204/298.08, 298.39; 313/231.31; 315/111.21

[56] References Cited

U.S. PATENT DOCUMENTS

| | | | |
|---|---|---|---|
| 5,330,606 | 7/1994 | Kubota et al. | 156/345 |
| 5,424,905 | 6/1995 | Nomura et al. | 361/235 |

FOREIGN PATENT DOCUMENTS

| | | |
|---|---|---|
| 58-42226 | 11/1983 | Japan . |
| 60-153129 | 12/1985 | Japan . |
| 62-273731 | 11/1987 | Japan . |
| 3-30424 | 8/1991 | Japan . |
| 60-61185 | 4/1994 | Japan . |

*Primary Examiner*—R. Bruce Breneman
*Assistant Examiner*—Joni Y. Chang
*Attorney, Agent, or Firm*—Wenderoth, Lind & Ponack

[57] ABSTRACT

A vacuum plasma processing apparatus includes a vacuum processing container accommodating a to-be-processed substrate, a feeding device for feeding a reaction gas to the container, a vacuumizing device for discharging a gas in the container therefrom, a susceptor for holding the to-be-processed substrate arranged in the container, split electrodes arranged in a deltaic lattice at a wall surface of the container facing the to-be-processed substrate, and a power source unit for impressing to the slit electrodes three-phase RF powers having three phases different from each other. When the electrodes are arranged in an orthogonal lattice at the wall surface of the continuer, the power source unit impresses thereto two-phase RF powers having two phases different from each other.

19 Claims, 16 Drawing Sheets

←— : PRINCIPAL LINE OF ELECTRIC FORCE

←— : PRINCIPAL LINE OF ELECTRIC FORCE

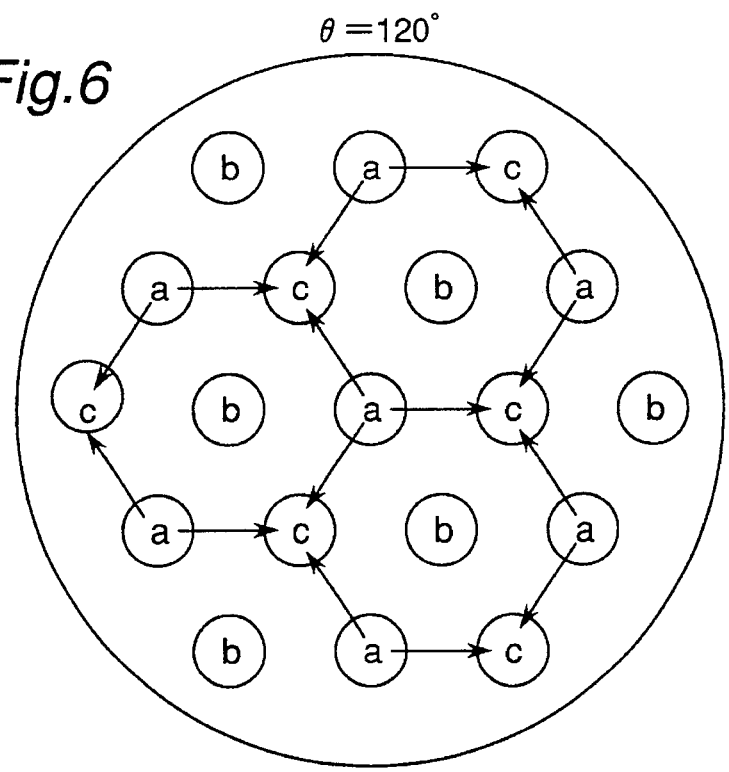
Fig.6  θ=120°
← : PRINCIPAL LINE OF ELECTRIC FORCE
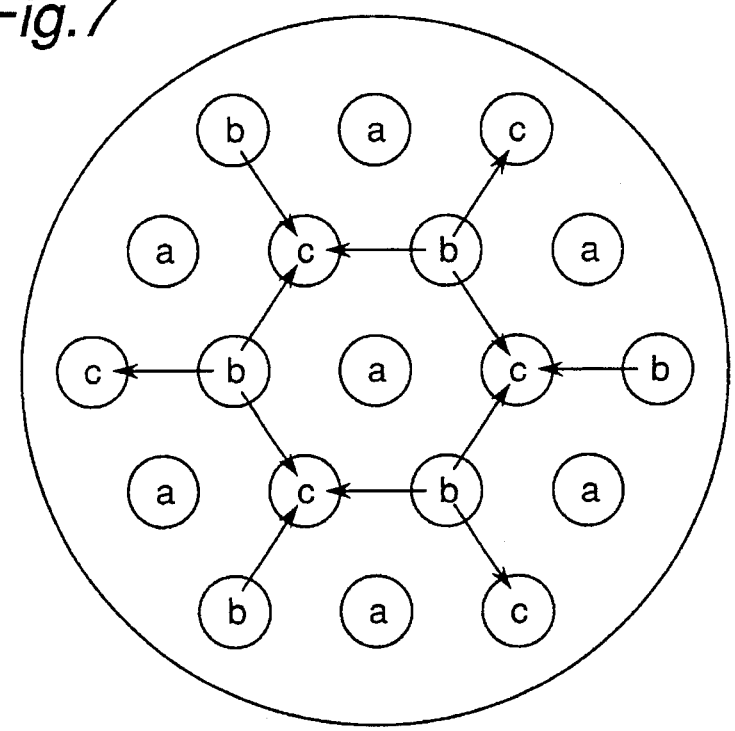
Fig.7  θ=180°
← : PRINCIPAL LINE OF ELECTRIC FORCE

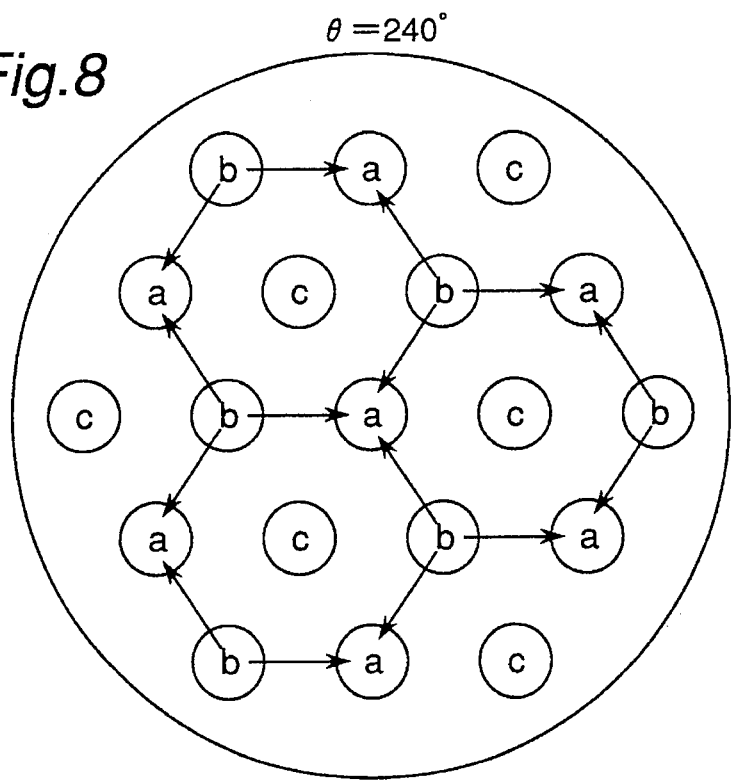
Fig.8   θ = 240°
← : PRINCIPAL LINE OF ELECTRIC FORCE
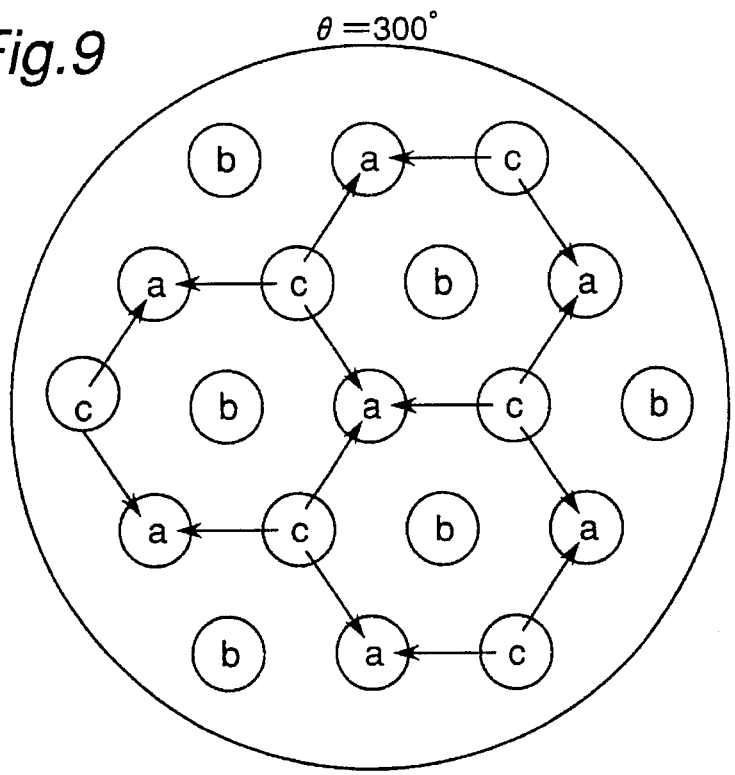
Fig.9   θ = 300°
← : PRINCIPAL LINE OF ELECTRIC FORCE

← : PRINCIPAL LINE OF ELECTRIC FORCE

← : PRINCIPAL LINE OF ELECTRIC FORCE

VACUUM PLASMA PROCESSING APPARATUS AND METHOD

BACKGROUND OF THE INVENTION

The present invention relates to a vacuum plasma processing apparatus and method used in processing a semiconductor wafer or a liquid crystal display substrate, etc. by way of dry etching, CVD, sputtering, or other kinds of surface treatment.

A conventional vacuum plasma processing apparatus will be described by way of example.

The constitution of the apparatus is shown in FIGS. 21 and 22. In FIG. 21, a susceptor 3 for holding a to-be-processed board 2 is disposed in a vacuum processing container 1 which has a reaction gas feed port 7 and a vacuum pump 8. An RF generator 4 is connected to the susceptor 3. A cylindrical electrode 5 arranged above the susceptor 3 is connected to an RF generator 6. Specifically, the cylindrical electrode 5 is divided or split to three parts, and three parts are connected to the corresponding RF generators 6 of every 120° or so different phases.

The operation of the apparatus will now be described.

While the gas in the container is discharged from the container 1 by the vacuum pump 8, a reaction gas is introduced into the container 1 from the feed port 7 to bring about plasma. The reaction gas in the container is kept at a suitable pressure. RF powers of phases approximately 120° different each other are applied from the RF generators 6 to the split three parts of the electrode 5, whereby an electric field is formed in the container 1. As a result, plasma is generated because of the acceleration of electrons by the electric field. The to-be-processed board 2 is accordingly surface-treated in the vacuum plasma processing apparatus.

At the same time, the energy of ions entering the to-be-processed board 2 is controllable in the apparatus as the RF generator 4 impresses an RF power to the susceptor 3.

In the conventional structure as above, the intensity of the plasma is large in the vicinity of the electrode 5, whereas the intensity becomes small as it is closer to the center of the container 1. Therefore, the etching speed and the forming speed of a film on the substrate 2 become irregular, turning the apparatus unfit to process particularly a substrate of a large area.

SUMMARY OF THE INVENTION

The object of the present invention is therefore to provide a vacuum plasma processing apparatus and method which can generate uniform plasma on a to-be-processed substrate.

In accomplishing these and other objects, according to one aspect of the present invention, there is provided a vacuum plasma processing apparatus comprising: a vacuum processing container accommodating a to-be-processed substrate; a feeding means for feeding a reaction gas to the container; a vacuumizing means for discharging a gas in the container therefrom; a susceptor for holding the to-be-processed substrate arranged in the container; split electrodes arranged in a lattice at a wall surface of the container facing the to-be-processed substrate; and a power source unit for impressing to the slit electrodes RF powers having phases different from each other, wherein the electrodes are arranged in such a lattice at the wall surface of the container facing the to-be-processed substrate that phases and phase voltages of the RF powers form a Lissajous figure.

According to another aspect of the present invention, there is provided a vacuum plasma processing method comprising steps of: feeding a reaction gas to a vacuum processing container accommodating a to-be-processed substrate which is held on a susceptor and discharging a gas in the container therefrom; and impressing RF powers having phases different from each other split electrodes in such a lattice at the wall surface of the container facing the to-be-processed substrate that phases and phase voltages of the RF powers form a Lissajous figure.

BRIEF DESCRIPTION OF THE DRAWINGS

These and other objects and features of the present invention will become clear from the following description taken in conjunction with the preferred embodiments thereof with reference to the accompanying drawings, in which:

FIG. 6 is an instantaneous distribution diagram of principal lines of electric forces when the phase θ of the RF power impressed to the split electrodes of the vacuum plasma processing apparatus of FIG. 1 is 120°;

FIG. 7 is an instantaneous distribution diagram of principal lines of electric forces when the phase θ of the RF power impressed to the split electrodes of the vacuum plasma processing apparatus of FIG. 1 is 180°;

FIG. 8 is an instantaneous distribution diagram of principal lines of electric forces when the phase θ of the RF power impressed to the split electrodes of the vacuum plasma processing apparatus of FIG. 1 is 240°;

FIG. 9 is an instantaneous distribution diagram of principal lines of electric forces when the phase θ of the RF power impressed to the split electrodes of the vacuum plasma processing apparatus of FIG. 1 is 360°;

DETAILED DESCRIPTION OF THE PREFERRED EMBODIMENTS

Figure 1:
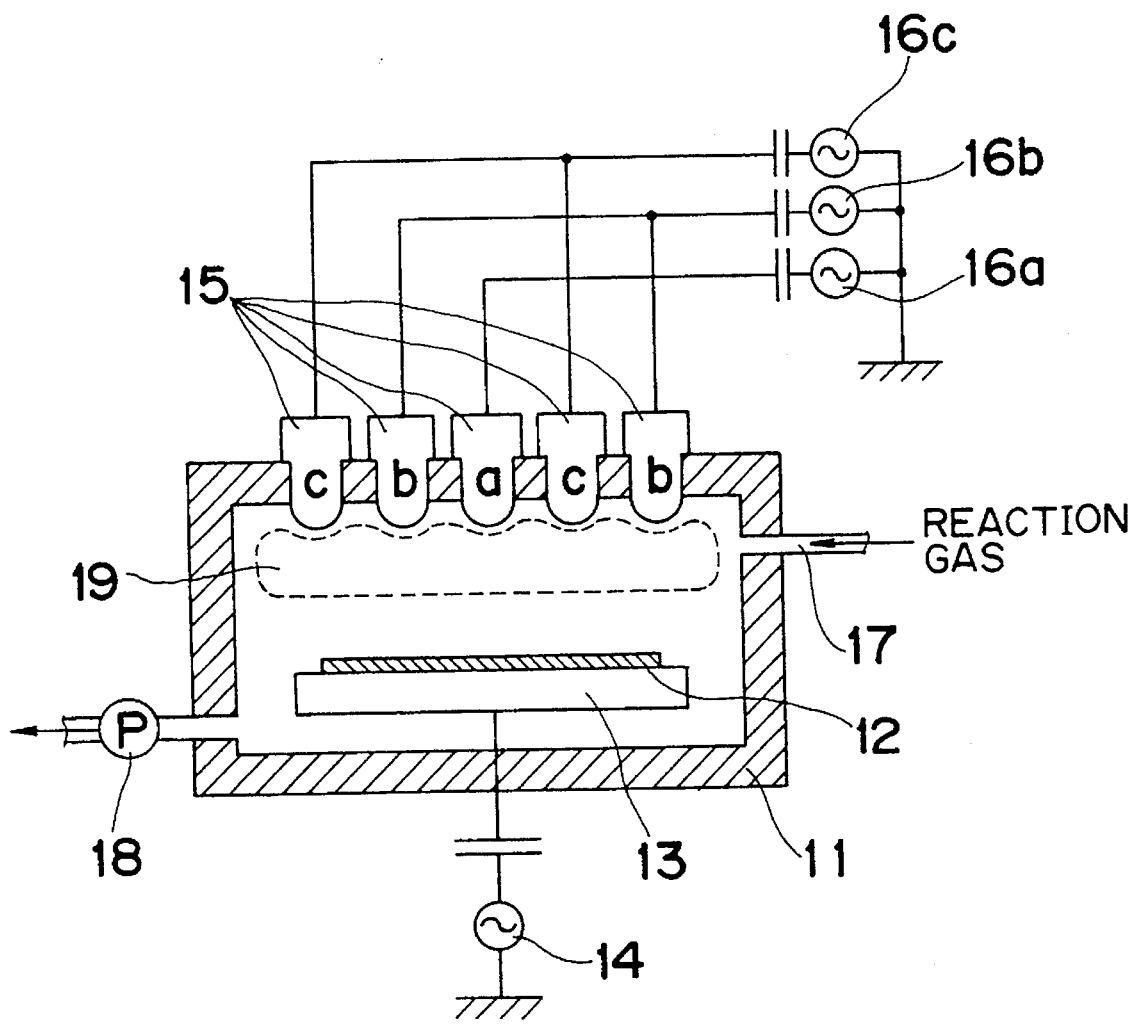
FIG. 1 is a structural diagram of a vacuum plasma processing apparatus according to a first embodiment of the present invention.

Before the description of the present invention proceeds, it is to be noted that like parts are designated by like reference numerals throughout the accompanying drawings.

The present invention will be described in conjunction with preferred embodiments thereof with reference to the accompanying drawings.

Figure 2:
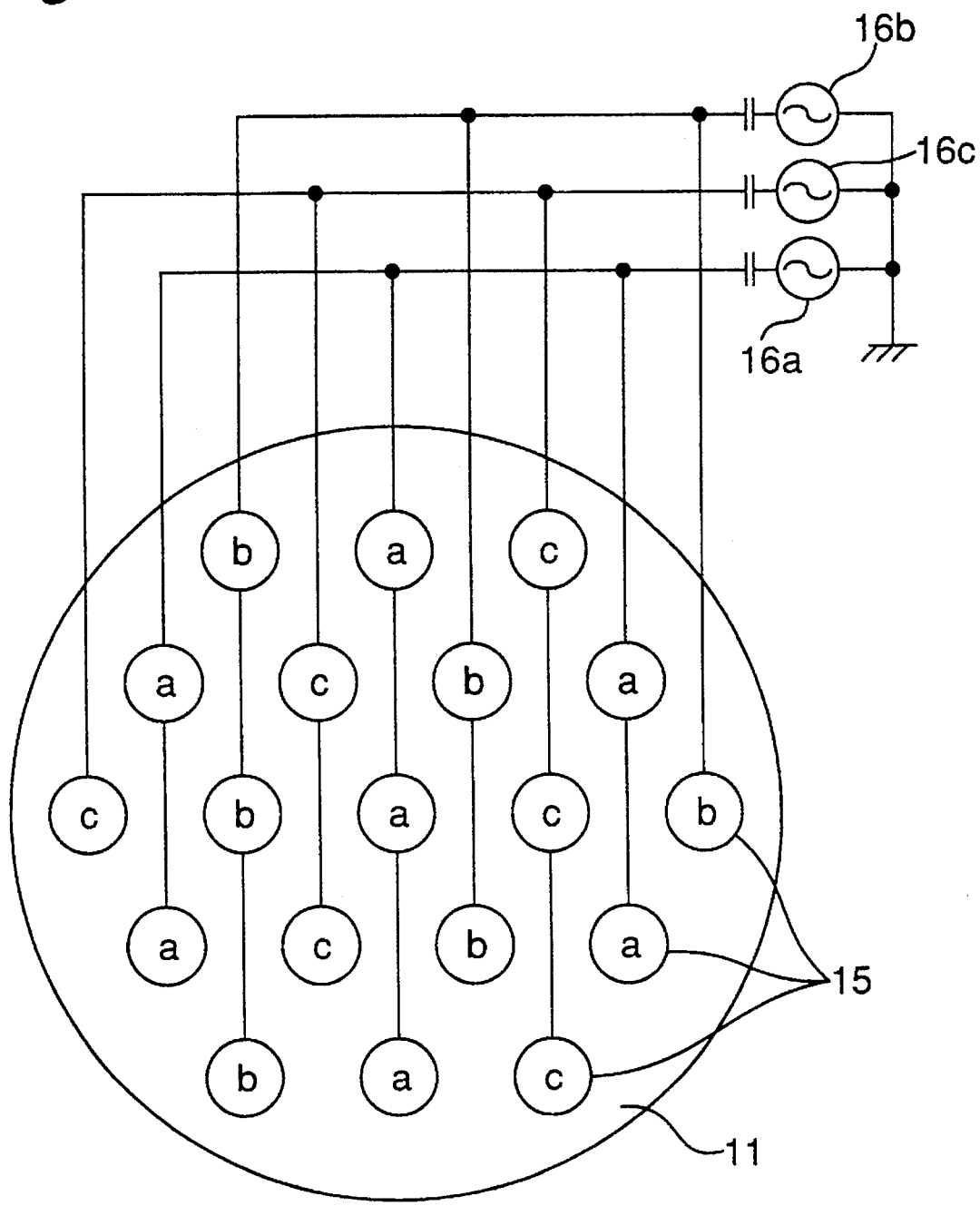
FIG. 2 is an arrangement diagram of split electrodes in the vacuum plasma processing apparatus of FIG. 1.

FIGS. 1 and 2 are structural diagrams of a vacuum plasma processing apparatus according to a first embodiment of the present invention. In FIG. 1, a susceptor 13 holding a to-be-processed substrate 12 is set in a vacuum processing container 11 having a reaction gas feed port 7 and a vacuum pump 18. The susceptor 13 is connected to an RF generator 14 provided for controlling the energy of ions. As is shown in FIG. 2, projecting semi-spherical electrodes (split electrodes) 15a, 15b, 15c are arranged to assume a deltaic lattice at the wall surface of an insulator of the vacuum processing container 11 facing the susceptor 13. RF generators 16a, 16b, 16c are respectively connected to the split electrodes 15a, 15b, 15c to generate plasma.

The above apparatus operates in a manner as will be described below.

Figure 3:
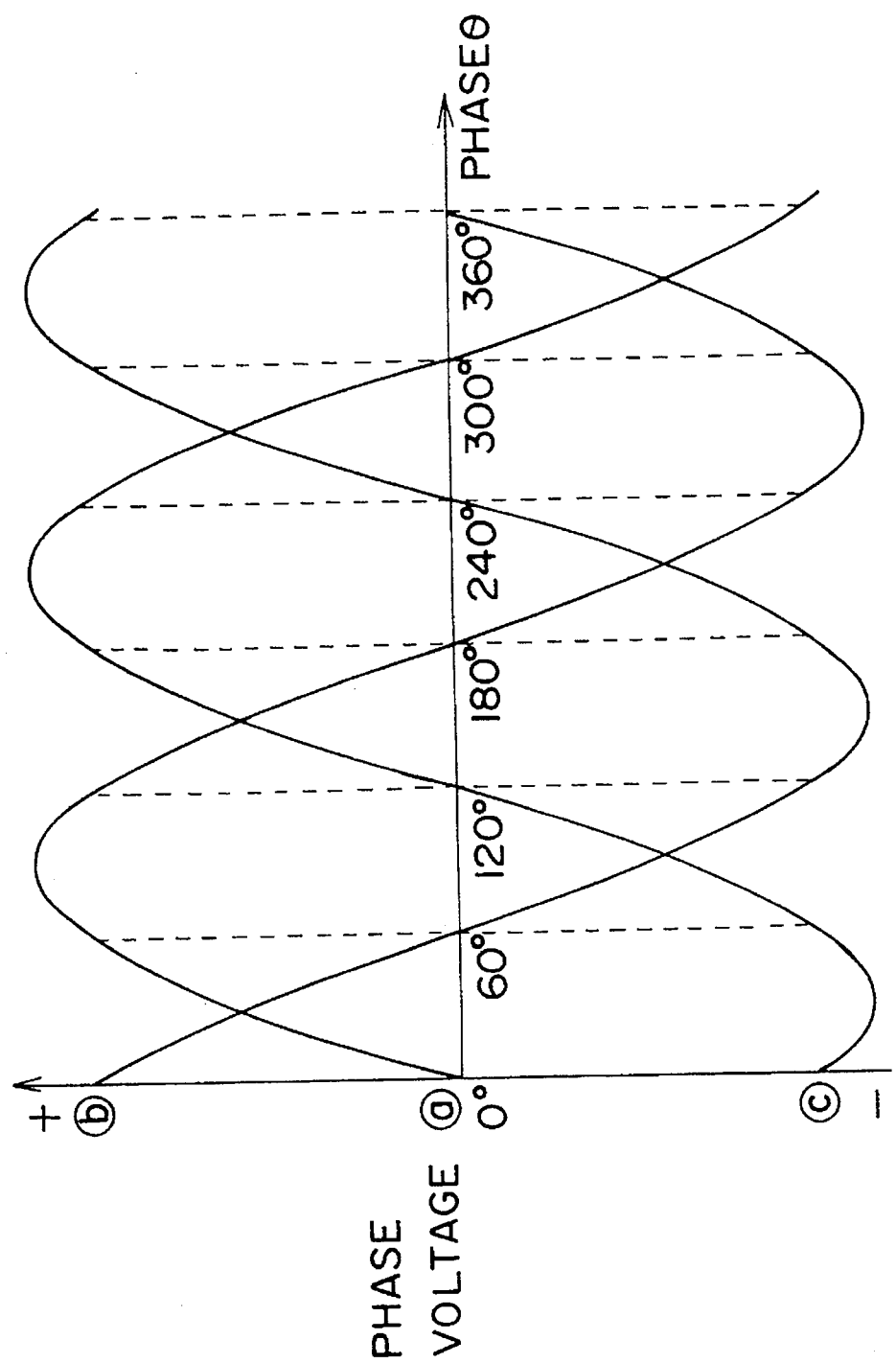
FIG. 3 is a diagram showing the phase difference of RF powers impressed to the split electrodes of the vacuum plasma processing apparatus of FIG. 1.
Figure 4:
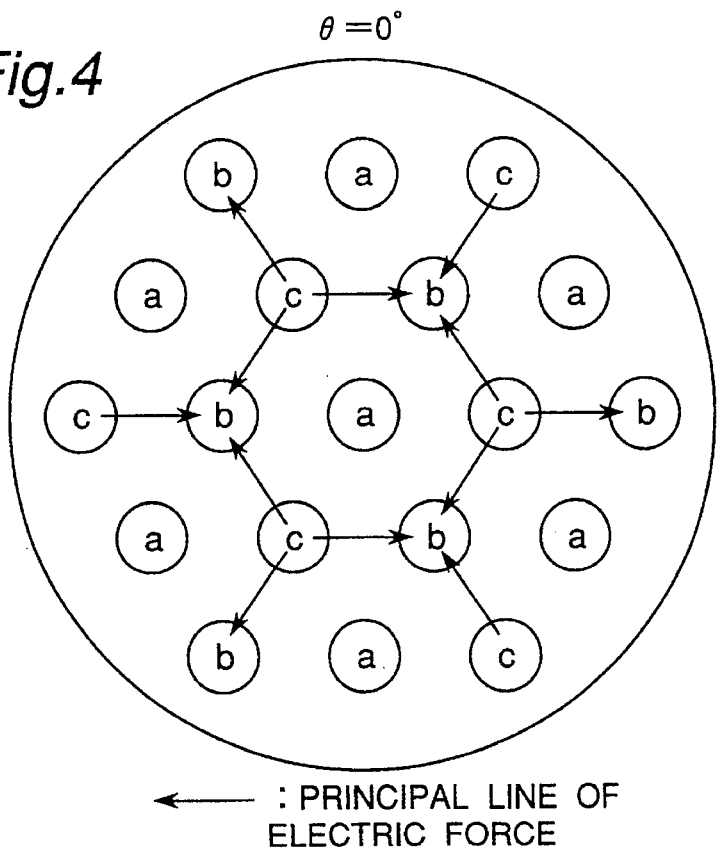
FIG. 4 is an instantaneous distribution diagram of principal lines of electric forces when the phase θ of the RF power impressed to the split electrodes of the vacuum plasma processing apparatus of FIG. 1 is 0°.
Figure 5:
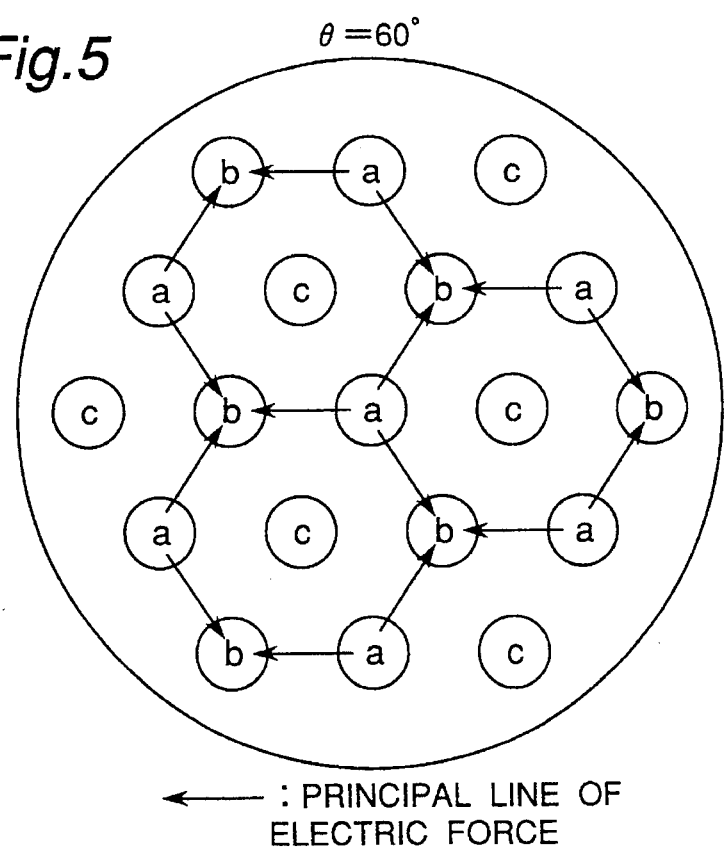
FIG. 5 is an instantaneous distribution diagram of principal lines of electric forces when the phase θ of the RF power impressed to the split electrodes of the vacuum plasma processing apparatus of FIG. 1 is 60°.

A reaction gas to generate plasma is fed from a reaction gas feed port 17 into the vacuum processing container 11. During this time, the gas in the container 11 is discharged by the vacuum pump 18. The reaction gas is kept in the container 11 at a suitable pressure. Subsequently, RF powers of phases different approximately 120° each other as shown in FIG. 3 are impressed from the RF generators 16a, 16b, 16c to the electrodes 15a, 15b, 15c, respectively. In consequence, an electric field is generated in the vacuum processing container 11. Since the electrons are accelerated by the electric field, plasma is produced. The lines of electric forces quickly change at this time because of the phase difference of the RF powers. The change of the principal lines of electric forces is represented in FIGS. 4 through 9. In FIGS. 1, 4 through 9, reference characters (a), (b), and (c) denote the electrode 15a, 15b, and 15c, respectively. FIG. 4 indicates the state of the principal lines of electric forces when the phase θ is 0° in FIG. 3. Similarly, FIGS. 5, 6, 7, 8, and 9 respectively show the states when the phase θ is 60°, 120°, 180°, 240°, and 360°. Owing to the quick change of the lines of electric forces as depicted hereinabove, it becomes possible to generate uniform plasma 19 along the wall surface in the container 11 where the electrodes 15a, 15b, 15c are arranged in the deltaic lattice.

Moreover, if an RF power is optionally applied to the susceptor 13 by the RF generator 14, the density of the plasma 19 and the energy of ions entering the substrate 12 are controllable separately from each other, thereby achieving vacuum plasma processing in the optimum state.

Figure 10:
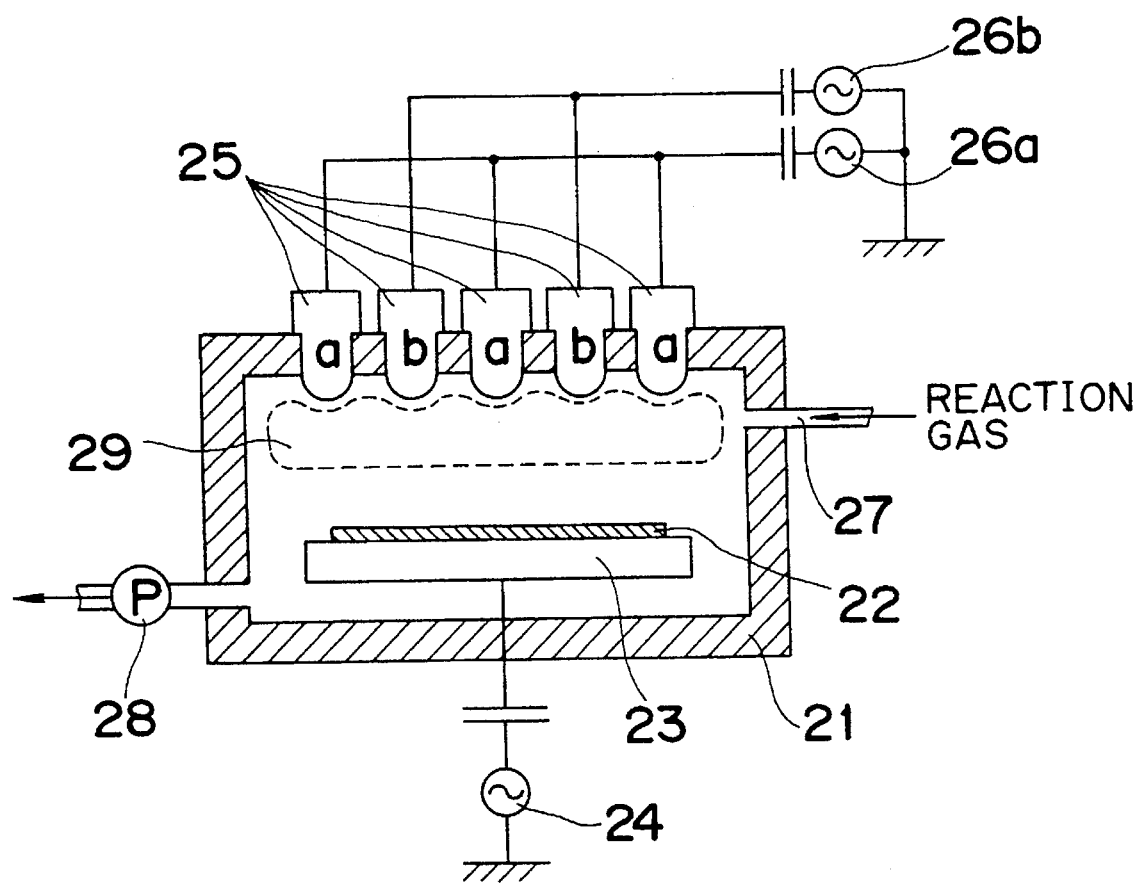
FIG. 10 is a structural diagram of a vacuum plasma processing apparatus according to a second embodiment of the present invention.
Figure 11:
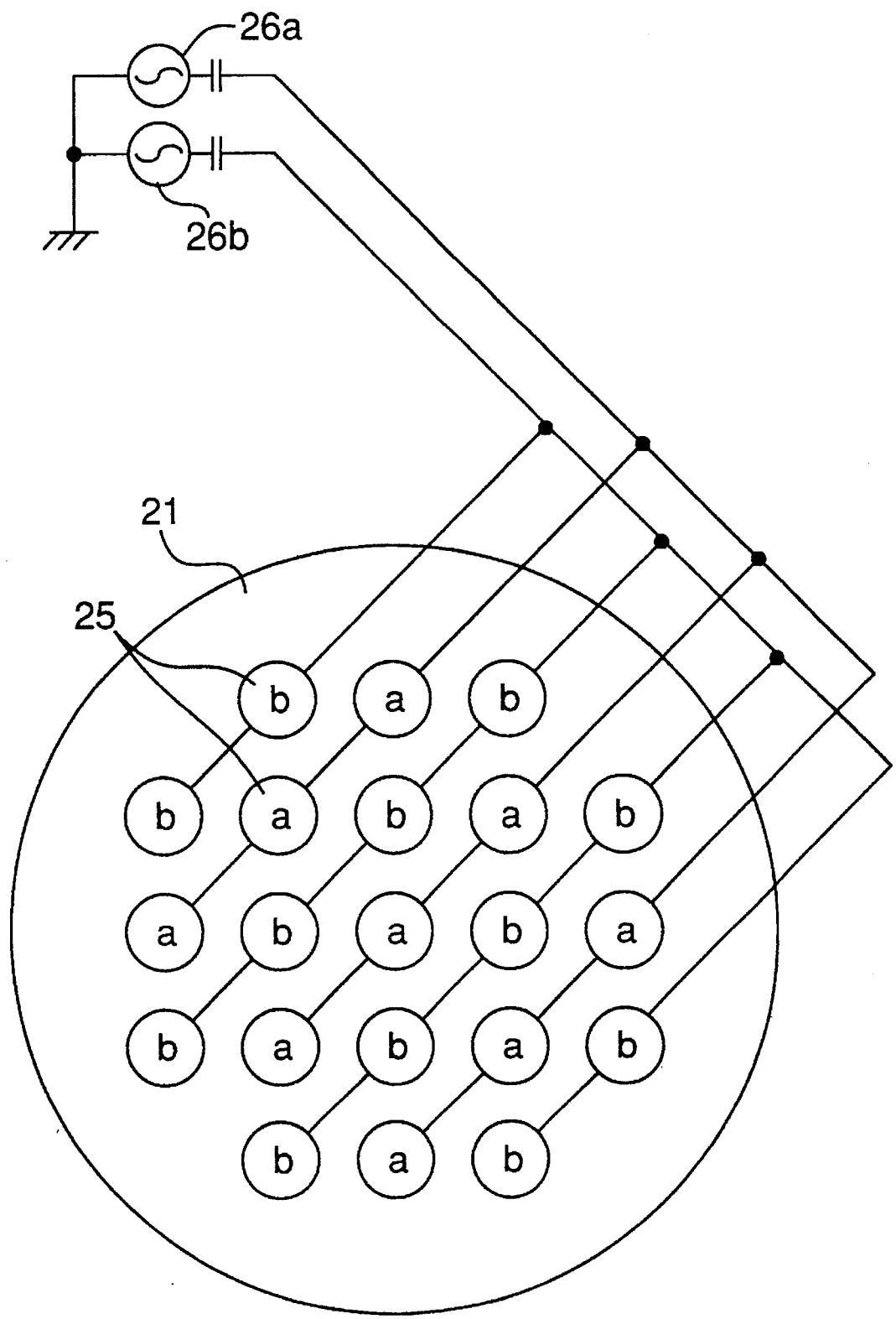
FIG. 11 is an arrangement diagram of split electrodes in the vacuum plasma processing apparatus of FIG. 10.

The constitution of a vacuum plasma processing apparatus according to a second embodiment of the present invention is shown in FIGS. 10 and 11. In FIG. 10, a vacuum processing container 21 has a reaction gas feed port 27 and a vacuum pump 28. A susceptor 23 loading a to-be-processed substrate 22 thereon is set in the container 21. The susceptor 23 is connected to an RF generator 24 for controlling the energy of ions. At the wall surface of an insulator of the container 21 confronting to the susceptor 23 are latticed projecting semi-spherical electrodes (split electrodes) 25a, 25b orthogonal to each other as is clearly shown in FIG. 11. RF generators 26a, 26b are connected to the split electrodes 25a, 25b to generate plasma.

The operation of the above vacuum plasma processing apparatus will be described now.

Figure 12:
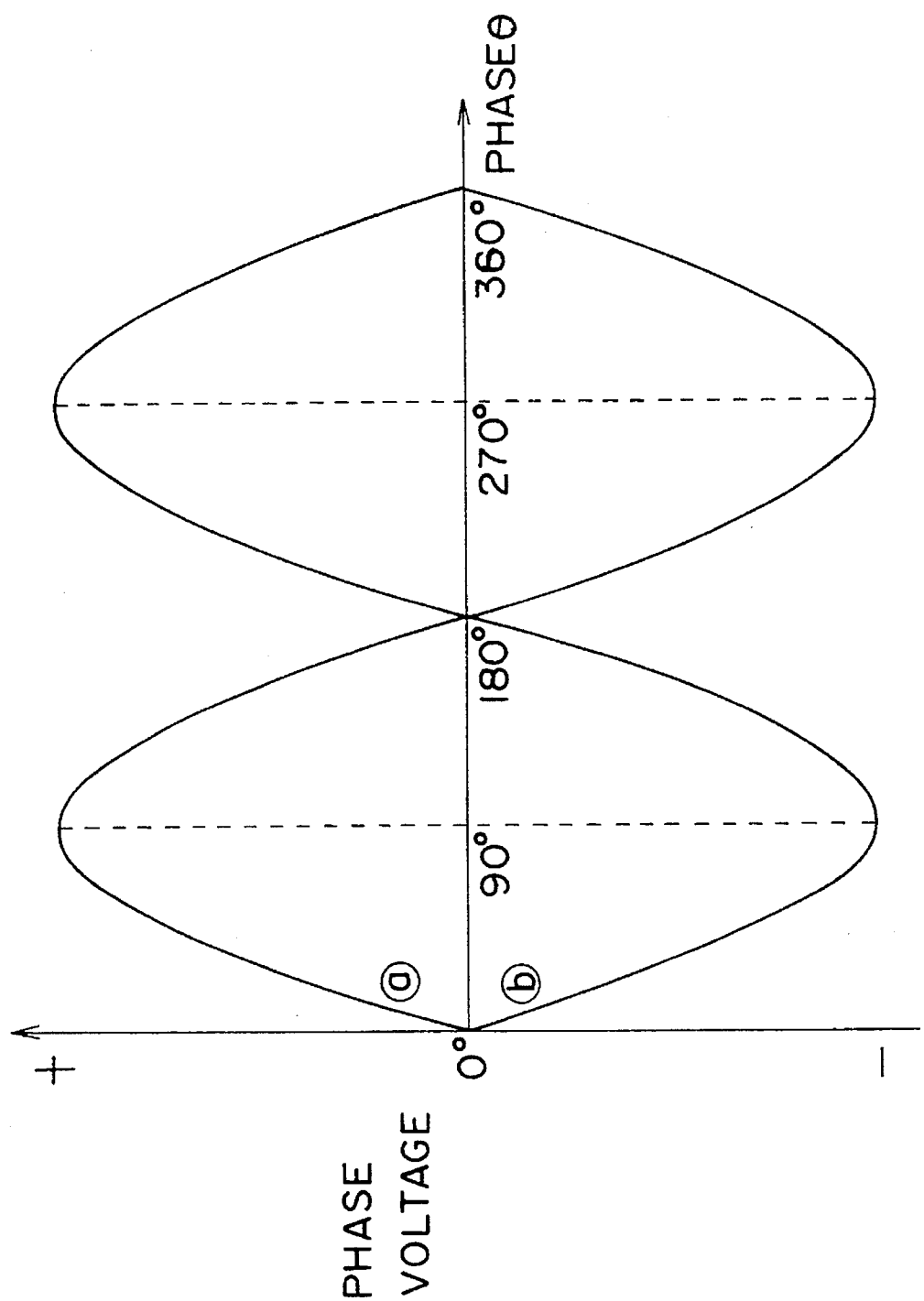
FIG. 12 is a diagram showing the phase difference of RF powers impressed to the split electrodes of the vacuum plasma processing apparatus of FIG. 10.
Figure 13:
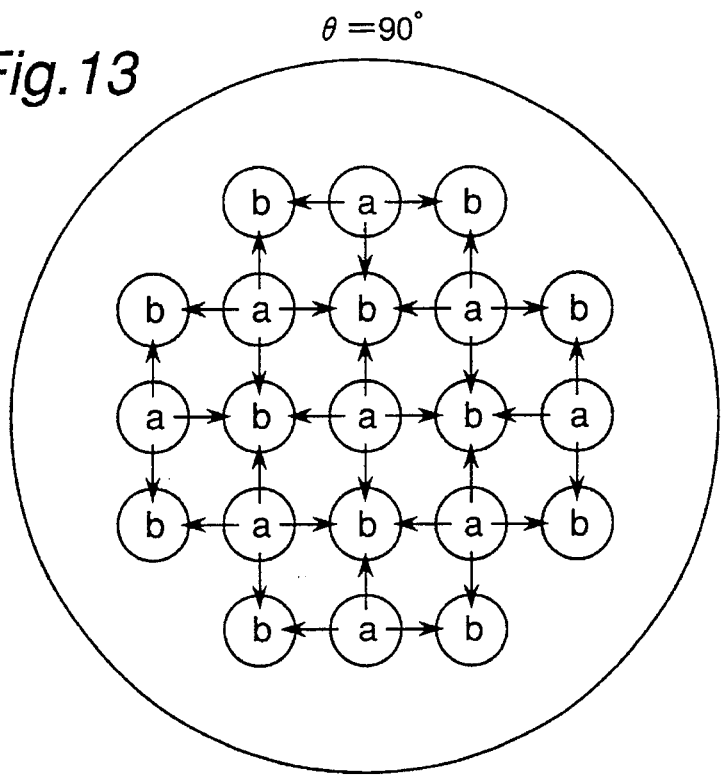
FIG. 13 is an instantaneous distribution diagram of principal lines of electric forces when the phase θ of the RF power impressed to the split electrodes of the vacuum plasma processing apparatus of FIG. 10 is 90°.
Figure 14:
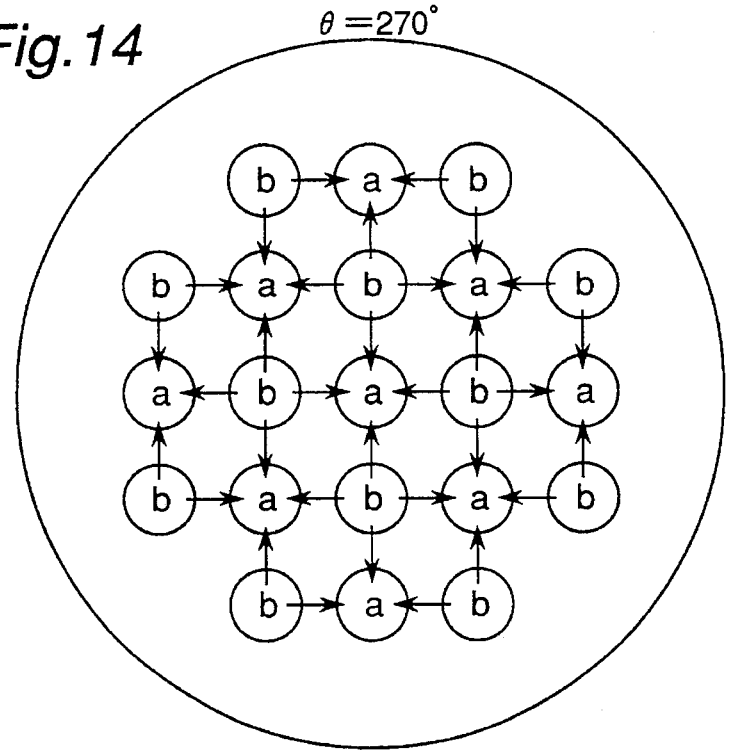
FIG. 14 is an instantaneous distribution diagram of principal lines of electric forces when the phase θ of the RF power impressed to the split electrodes of the vacuum plasma processing apparatus of FIG. 1 is 270°.

While the gas is discharged from the vacuum processing container 21 by the vacuum pump 28, a reaction gas to generate plasma is fed through the feed port 27 into the container 21. The reaction gas is maintained in the container 21 at a suitable pressure. RF powers of phases of about 180° difference as shown in FIG. 12 are impressed to the orthogonal electrodes 25a, 25b from the RF generators 26a, 26b, whereby an electric field is generated in the container 21. The electric field accelerates electrons, leading to the generation of plasma. At this time, the lines of electric forces quickly change due to the phase difference of the RF powers. The change of the principal lines of electric forces is indicated in FIGS. 13 and 14 respectively representing the state where the phase θ is 90° in FIG. 12 and 270° in FIG. 14. In FIGS. 10, 11, 13, and 14, reference characters (a) and (b) denote the electrode 25a and 25b, respectively. The above rapid change of the lines of electric forces contributes to form uniform plasma 29 along the wall surface in the container 21 where the electrodes 25a, 25b are disposed.

Moreover, when an RF power is impressed to the susceptor 23 from the RF generator 24, the density of the plasma 29 and the energy of ions entering the substrate 22 can be controlled individually. Accordingly, optimum vacuum plasma processing is realized.

Figure 16A:
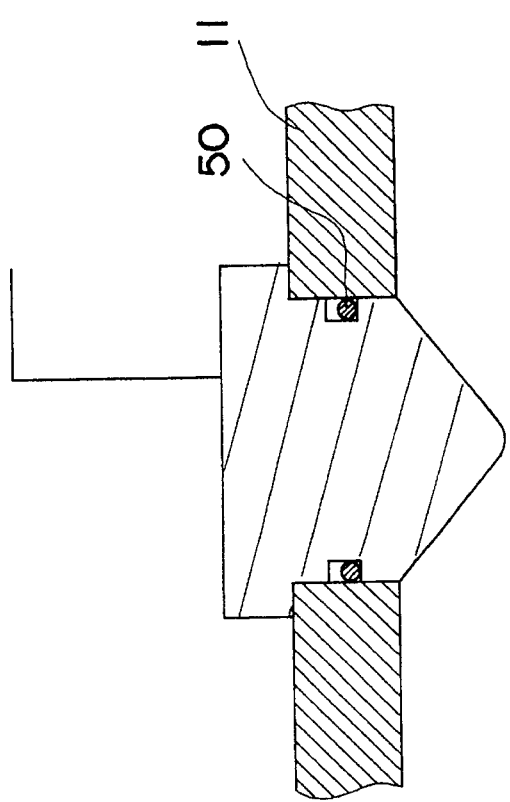
FIGS. 16A and 16B are a sectional side view and a plan view of the split electrode which is a circular cone with the electrode arranged at the container.
Figure 16B:
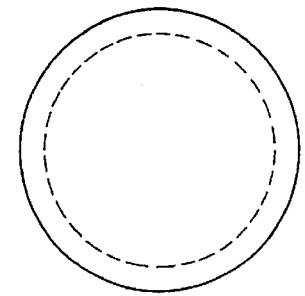
Figure 15A:
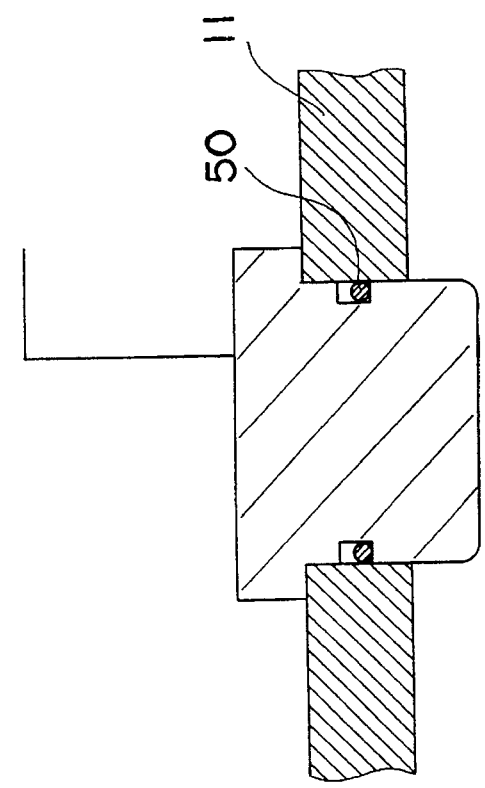
FIGS. 15A and 15B are a sectional side view and a plan view of the split electrode which is a circular cylinder with the electrode arranged at the container.
Figure 15B:
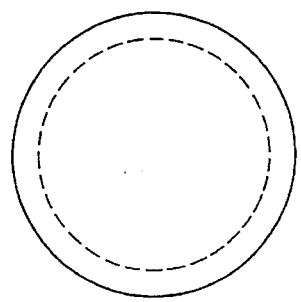
Figure 18A:
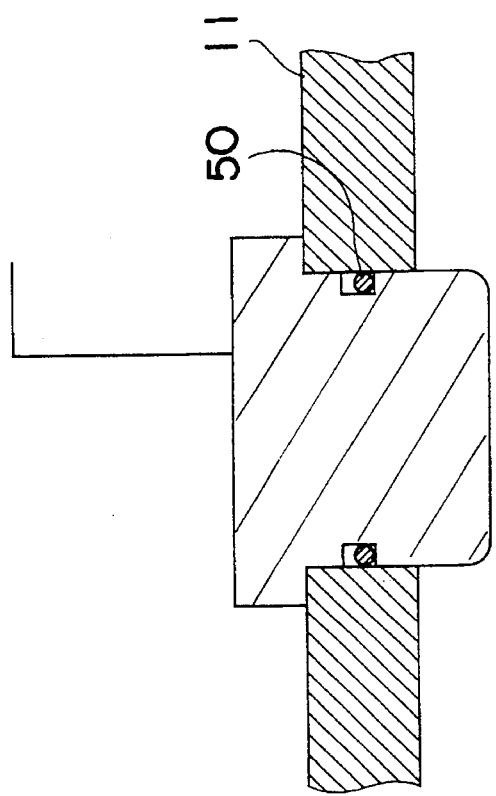
FIGS. 18A and 18B are a sectional side view and a plan view of the split electrode which is a hexagonal prism having curved corners with the electrode arranged at the container.
Figure 18B:
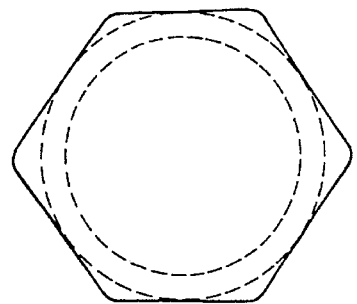
Figure 17A:
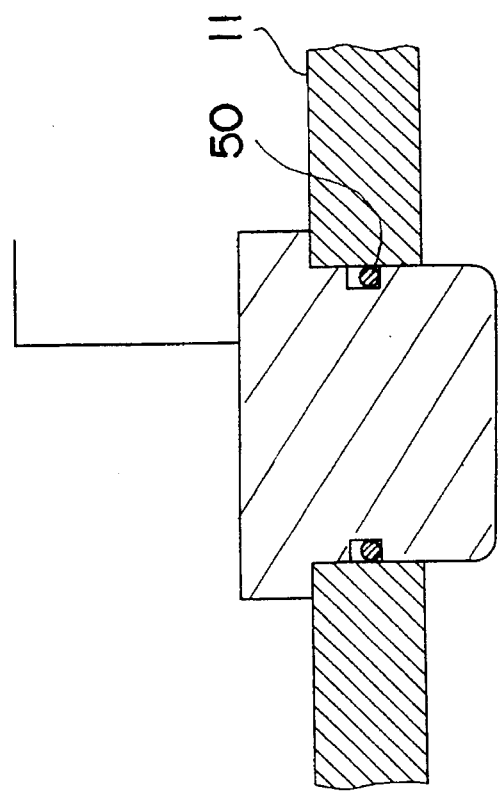
FIGS. 17A and 17B are a sectional side view and a plan view of the split electrode which is a quadrangular prism having curved corners with the electrode arranged at the container.
Figure 17B:
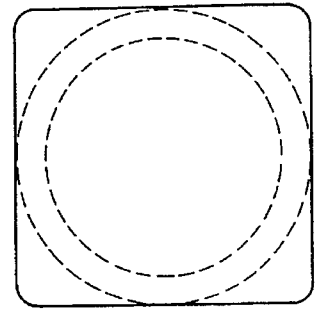

Although the split electrodes are projecting or convex semi-spherical in the first and second embodiments as above, the electrodes may be formed in different kinds of shapes, for example, a circular cylinder of FIGS. 15A and 15B, a circular cone of FIGS. 16A and 16B, a quadrangular prism having curved corners as in FIGS. 17A and 17B, or a hexagonal prism with curved corners as illustrated in FIGS. 18A and 18B. Reference numeral 50 denotes a packing between the electrode and the container 11 in FIGS. 15A, 16A, 17A, and 18A. The reason that each electrode has the projecting semi-spherical surface is to increase the exposed area of each electrode which is exposed to the plasma. The reason why each corner of the electrode should be curved is to prevent any abnormal electric discharge at a non-curved corner of each electrode.

Figure 19:
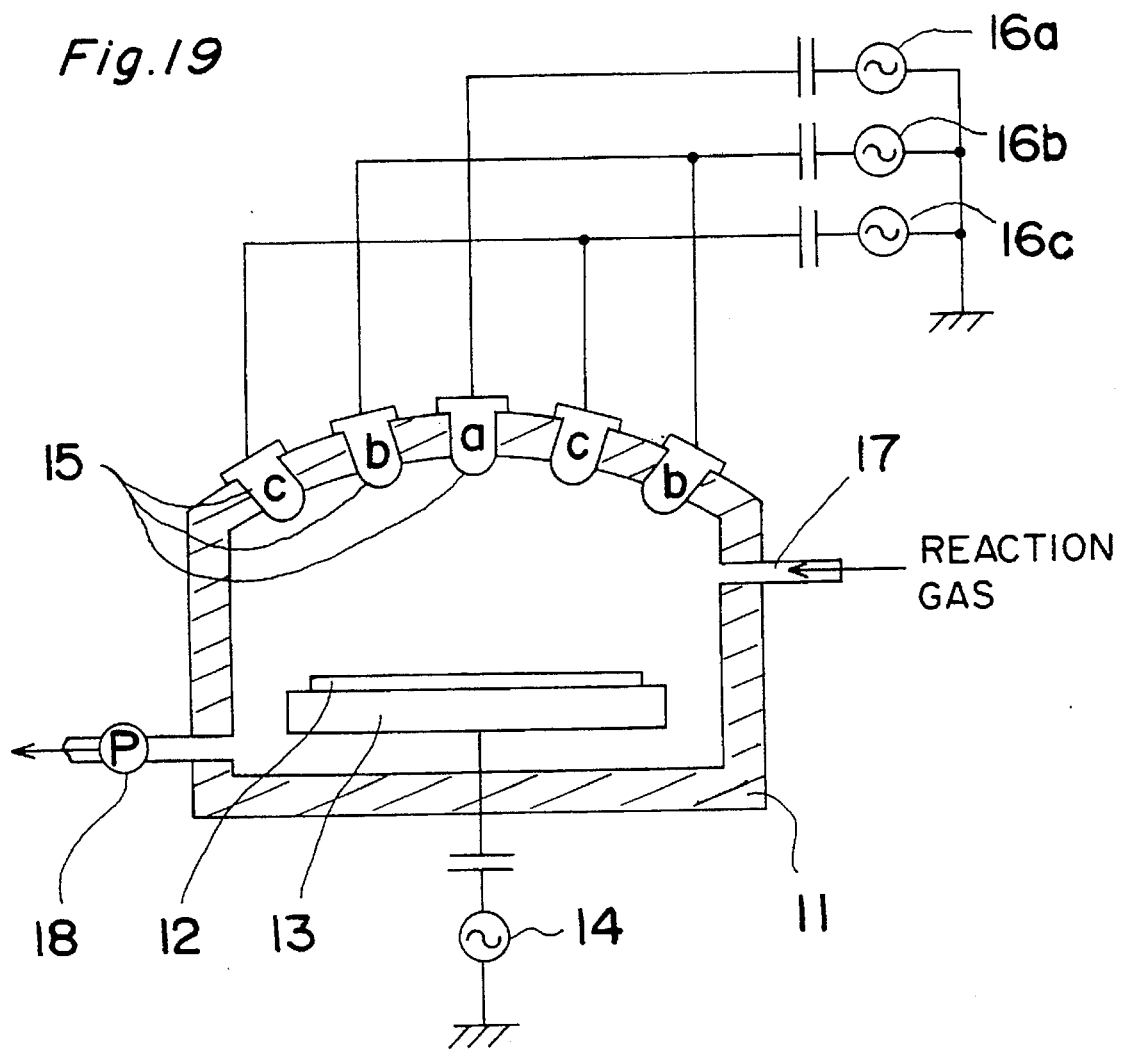
FIG. 19 is a structural diagram of a vacuum plasma processing apparatus wherein the wall surface of an insulating body of a vacuum processing container accommodating split electrodes is semi-spherical as another embodiment of the present invention.

The wall surface of the insulator of the vacuum processing container is a flat surface in the first and second embodiments. However, a semi-spherical surface as shown in FIG. 19 may be employable the present invention.

Figure 20:
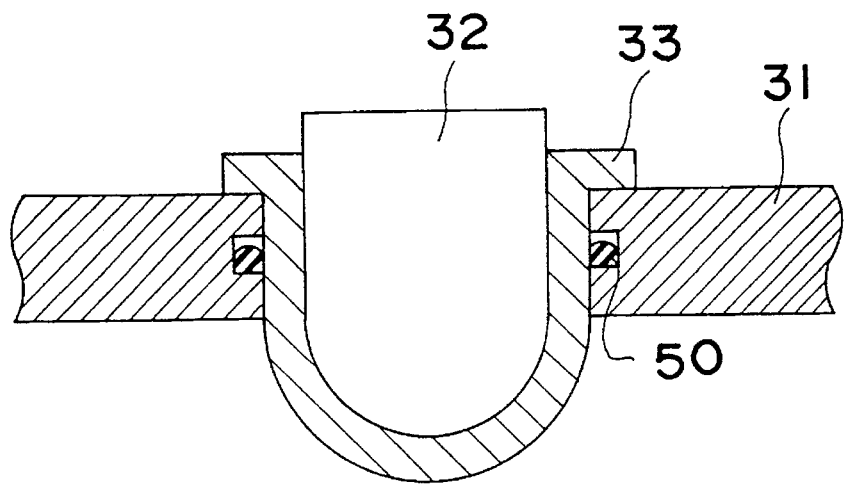
FIG. 20 is a structural diagram when an insulating part is arranged between the wall surface of a vacuum processing container accommodating the split electrodes and the split electrode while the wall surface is a conductive body as a further embodiment of the present invention.

Additionally, although the wall surface of the vacuum processing container is the insulator in the first and second embodiments, the present invention is applicable to a mechanism in FIG. 20 wherein a wall surface 31 of the vacuum processing container accommodating split electrodes 32 is rendered a conductive body, while an insulating component 33 is disposed between each electrode 32 and the wall surface 31.

Although in the embodiments the electrodes are arranged in the deltaic lattice or orthogonal lattice, the electrodes may be arranged in such a lattice at the wall surface of the container facing the to-be-processed substrate that the phases and phase voltages of the RF powers form a Lissajous figure such as figures shown in FIGS. 3 and 12. In the deltaic lattice, the shape of each deltaic shape is not limited to a regular triangle which is shown in FIG. 2 and formed by the electrodes 15a, 15b, and 15c and may be formed in an isosceles triangle, for example. Moreover, the shape of each electrode may be formed in such a shape that the phases and phase voltages of the RF powers form a Lissajous figure such as figures shown in FIGS. 3 and 12.

Furthermore, as an example, each electrode 15, 25, 32 is made of aluminum, the insulator of the container 11, 21 is made of ceramic, the wall surface 31 is made of stainless steel, and the insulating component 33 is made of ceramic, preferably.

Figure 23:
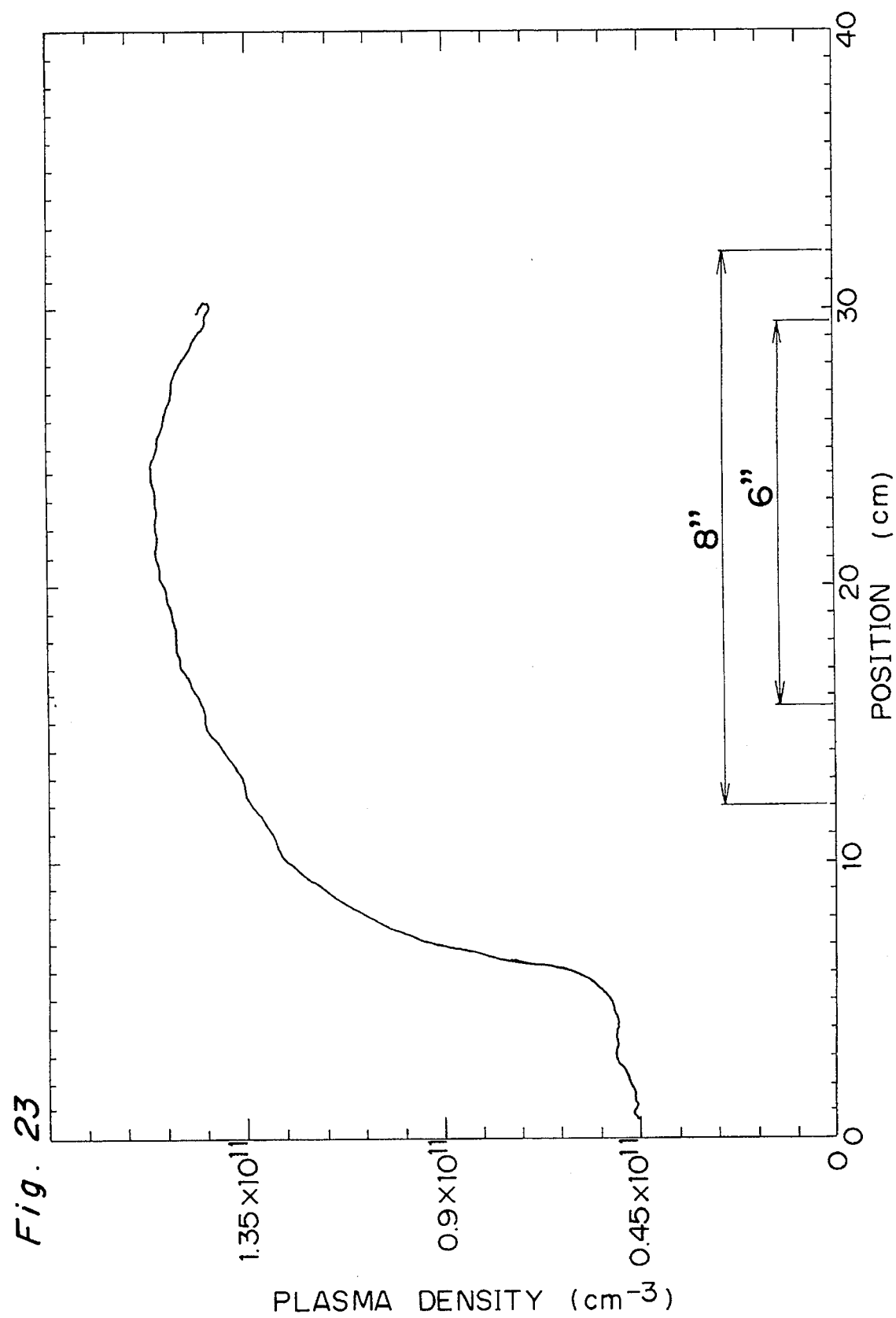
FIG. 23 is a graph showing the relationship between the positions of 6-inch and 8-inch substrates and the plasma density thereon in a case where the apparatus according to the first embodiment of the present invention is used.

FIG. 23 shows the relationship between the positions of 6-inch and 8-inch substrates and the plasma density thereon in a case where the apparatus according to the first embodiment of the present invention is used while at the inner pressure of the container of 5 mTorr and Ar of 30SCCM, RF powers of 100 W are impressed to the electrodes 15a, 15b, 15c. The occupied position of each substrate is indicated by 6" and 8" in FIG. 23 and the reference center of each substrate is a position of 22 cm in FIG. 23. When the diameter of each electrode is 6 inch, the density of the plasma is $1.0 \times 10^{11}$ cm$^{-3}$ and the uniformity thereof is ±4.8%. When the diameter of each electrode is 8 inch, the density of the plasma is $1.0 \times 10^{11}$ cm$^{-3}$ and the uniformity thereof is ±10%.

Figure 21:
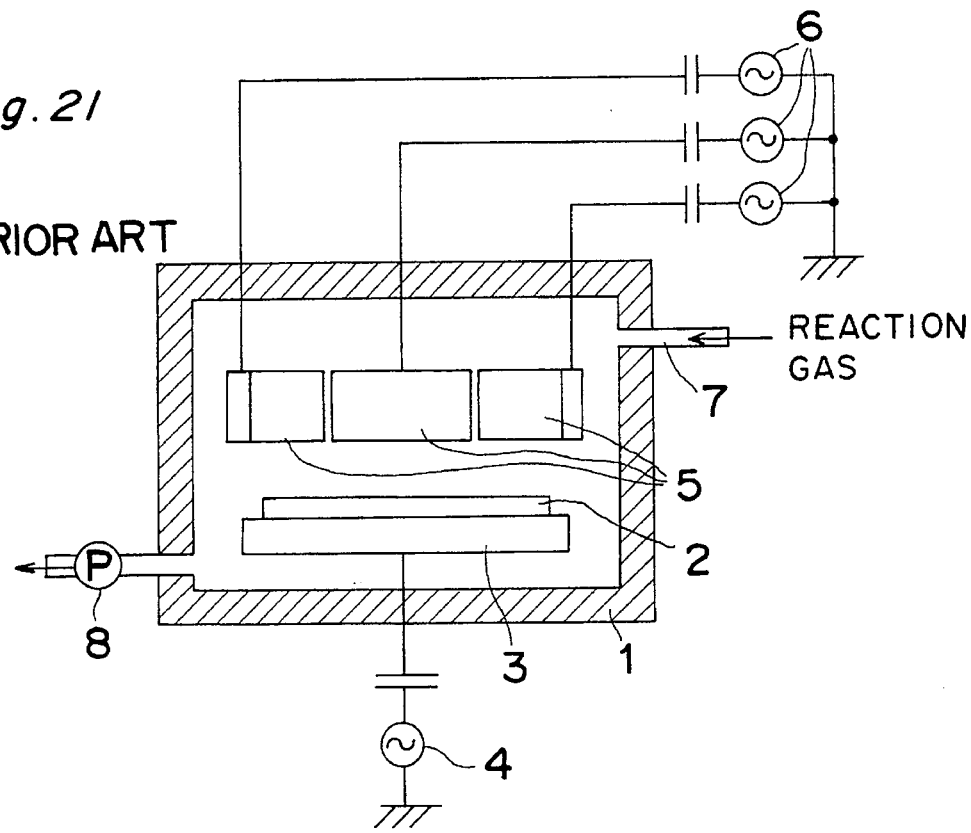
FIG. 21 is a structural diagram of a conventional vacuum plasma processing apparatus.
Figure 22:
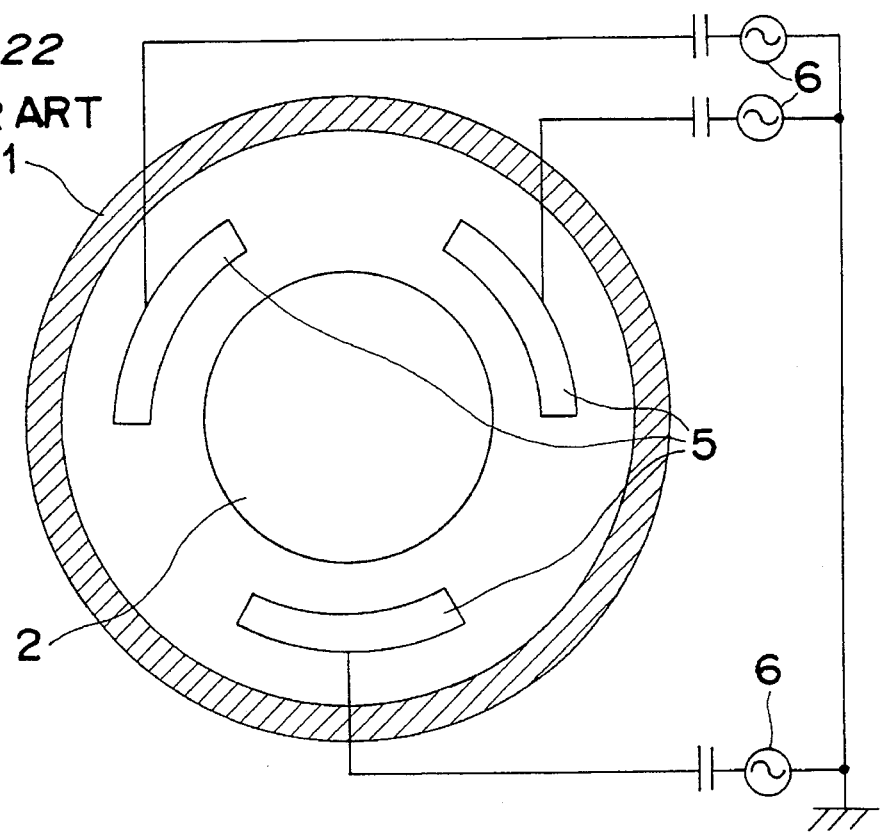
FIG. 22 is an arrangement diagram of split electrodes in the apparatus of FIG. 21.
Figure 24:
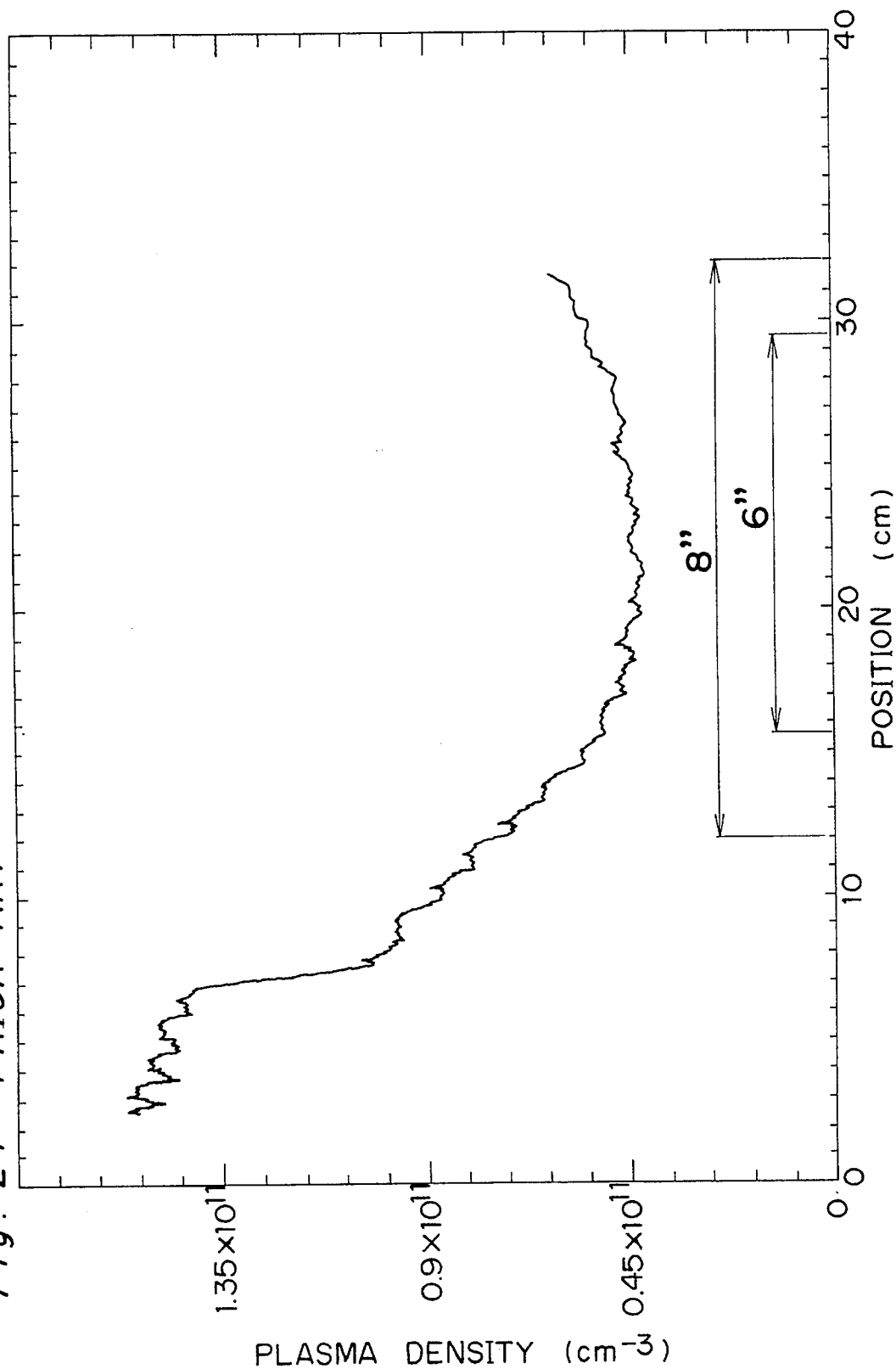
FIG. 24 is a graph showing the relationship between the positions of 6-inch and 8-inch substrates and the plasma density thereon in a case where the apparatus according to the conventional example shown in FIG. 21 is used.

FIG. 24 shows the relationship between the positions of 6-inch and 8-inch substrates and the plasma density thereon in a case where the apparatus according to the conventional example shown in FIG. 21 is used while under the inner pressure of the container of 5 mTorr and Ar of 30SCCM, RF powers of 100 W are impressed to the three electrodes 5. The occupied position of each substrate is indicated by 6' and 8' in FIG. 24 and the reference center of each substrate is a position of 22 cm in FIG. 23. When the diameter of each electrode is 6 inch, the density of the plasma is $4.5 \times 10^{10}$ cm$^{-3}$ and the uniformity thereof is ±6.5% which is worse than the example of the first embodiment. When the diameter of each electrode is 8 inch, the density of the plasma is $4.5 \times 10^{10}$ cm$^{-3}$ and the uniformity thereof is ±21% which is worse than the example of the first embodiment.

In three tests as specific examples of the embodiment of FIG. 1, aluminum alloy, silicon, and platinum are etched.

In a first test where aluminum alloy is etched, an etching gas mixing $BCl_3$, $Cl_2$, and $N_2$ with each other is introduced in the container and inner pressure of the container is maintained at 2 Pa. An RF power of 60 MHz is impressed to the electrodes 15a, 15b, and 15c in FIG. 2 at each 200 W while the phases are shifted about 120°. An RF power of 13.56 MHz is impressed to the susceptor 13 at 150 W. In the first test, the number of the electrodes is 19 and electrodes which have a shortest distance from the electrode 15a are electrodes 15b and 15c. As a result of the first test, the speed of the aluminum alloy is 1 μm/min and the uniformity of an 8-inch substrate is ±5% which is good. In cases where the numbers of the electrodes are changed to 7 and 14, the speed is not changed in the both cases, but the uniformity of the latter case is better than the former case.

In a second test where silicon is etched, an etching gas mixing HBr and $O_2$ with each other is introduced in the container and inner pressure of the container is maintained at 1 Pa. The method for impressing an RF power to the electrodes 15a, 15b, and 15c is the same as the first test. An RF power of 13.56 MHz is impressed to the susceptor 13 at 200 W. As a result of the second test, the speed of the silicon is 0.3 μm/min and the uniformity of an 8-inch substrate is ±4% which is good.

In a third test where platinum is etched, an etching gas of $Cl_2$ is introduced in the container and inner pressure of the container is maintained at 1 Pa. The method for impressing an RF power to the electrodes 15a, 15b, and 15c is the same as the first test. An RF power of 13.56 MHz is impressed to the susceptor 13 at 500 W. As a result of the third test, the speed of the platinum is 0.2 μm/min and the uniformity of an 8-inch substrate is ±4% which is good. In cases where the numbers of the electrodes are changed to 7 and 14, the deposition amount of reaction product in the latter is less than the former.

As is fully described hereinabove, according to the present invention, when RF powers of different phases are impressed to the split electrodes in the latticed arrangement on the wall surface in a vacuum processing container facing a susceptor holding the to-be-processed substrate thereon, an electric field is brought about between the split electrodes. Since the electric field quickly changes between the split electrodes, uniform high-density plasma is generated on the to-be-processed substrate. Moreover, when an RF power is applied to a lower electrode loading the to-be-processed substrate, the energy of ions reaching the substrate is independently controllable.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A vacuum plasma processing apparatus comprising:
   a vacuum processing container accommodating a to-be-processed substrate;

a feeding means for feeding a reaction gas to the container;

a vacuumizing means for discharging a gas in the container therefrom;

a susceptor for holding the to-be-processed substrate arranged in the container;

split electrodes arranged in a lattice at a wall surface of the container facing the to-be-processed substrate; and a power source unit for impressing to the split electrodes RF powers having phases different from each other, wherein the split electrodes are arranged in such a lattice at the wall surface of the container facing the to-be-processed substrate that phases and phase voltages of the RF powers form a Lissajous figure.

2. The vacuum plasma processing apparatus as claimed in claim 1, wherein the lattice is a deltaic lattice.

3. The vacuum plasma processing apparatus as claimed in claim 1, wherein the lattice is an orthogonal lattice.

4. The vacuum plasma processing apparatus as claimed in claim 2, wherein an RF power is added to the susceptor.

5. The vacuum plasma processing apparatus as claimed in claim 2, wherein the RF powers impressed to the split electrodes by the power source unit are three-phase RF powers of about 120° phase difference.

6. The vacuum plasma processing apparatus as claimed in claim 2, wherein each of the split electrodes has projecting semi-spherical surface facing the to-be-processed substrate.

7. The vacuum plasma processing apparatus as claimed in claim 2, wherein each of the split electrodes is formed in a circular cylinder.

8. The vacuum plasma processing apparatus as claimed in claim 2, wherein each of the split electrodes is formed in a quadrangular prism with curved corners.

9. The vacuum plasma processing apparatus as claimed in claim 2, wherein each of the split electrodes is formed in a hexagonal prism with curved corners.

10. The vacuum plasma processing apparatus as claimed in claim 2, wherein the container is made of insulating material.

11. The vacuum plasma processing apparatus as claimed in claim 2, wherein the container is made of conductive material and an insulating material is disposed between each of the electrode and the container.

12. The vacuum plasma processing apparatus as claimed in claim 3, wherein an RF power is added to the susceptor.

13. The vacuum plasma processing apparatus as claimed in claim 3, wherein the RF powers impressed to the slit electrodes by the power source unit are two-phase RF powers of about 180° phase difference.

14. The vacuum plasma processing apparatus as claimed in claim 3, wherein each of the split electrodes has projecting semi-spherical surface facing the to-be-processed substrate.

15. The vacuum plasma processing apparatus as claimed in claim 3, wherein each of the split electrodes is formed in a circular cylinder.

16. The vacuum plasma processing apparatus as claimed in claim 3, wherein each of the electrodes is formed in a quadrangular prism with curved corners.

17. The vacuum plasma processing apparatus as claimed in claim 3, wherein each of the electrodes is formed in a hexagonal prism with curved corners.

18. The vacuum plasma processing apparatus as claimed in claim 3, wherein the container is made of insulating material.

19. The vacuum plasma processing apparatus as claimed in claim 3, wherein the container is made of conductive material and an insulating material is disposed between each of the electrode and the container.

* * * * *